(12) United States Patent
Yoo et al.

(10) Patent No.: US 8,987,022 B2
(45) Date of Patent: Mar. 24, 2015

(54) LIGHT-EMITTING DEVICE PACKAGE AND METHOD OF MANUFACTURING THE SAME

(75) Inventors: Cheol-jun Yoo, Chungcheongnam-do (KR); Young-hee Song, Gyeonggi-do (KR); Seong-deok Hwang, Seoul (KR); Sang-hyun Lee, Gyeonggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 425 days.

(21) Appl. No.: 13/344,255

(22) Filed: Jan. 5, 2012

(65) Prior Publication Data

US 2012/0181555 A1    Jul. 19, 2012

(30) Foreign Application Priority Data

Jan. 17, 2011 (KR) .................. 10-2011-0004528
Jan. 20, 2011 (KR) .................. 10-2011-0005984

(51) Int. Cl.
*H01L 21/00* (2006.01)
*H01L 33/48* (2010.01)
*H01L 33/64* (2010.01)
*H01L 33/62* (2010.01)

(52) U.S. Cl.
CPC .............. *H01L 33/486* (2013.01); *H01L 33/64* (2013.01); *H01L 33/62* (2013.01); *H01L 2224/32245* (2013.01); *H01L 2224/48091* (2013.01); *H01L 2224/48247* (2013.01); *H01L 2224/49175* (2013.01); *H01L 2224/73265* (2013.01); *H01L 2224/92247* (2013.01); *H01L 2924/01079* (2013.01); *H01L 2224/48465* (2013.01); *H01L 2924/1815* (2013.01)
USPC .......... 438/27; 257/91; 257/98; 257/E33.066; 257/E33.059

(58) Field of Classification Search
CPC . H01L 51/50; H01L 51/5032; H01L 2251/56; H01L 2227/32; H01L 51/5296
USPC ......................... 257/91, 98; 438/27
See application file for complete search history.

(56) References Cited

U.S. PATENT DOCUMENTS

| | | | |
|---|---|---|---|
| 7,211,832 B2 | 5/2007 | Hirose | |
| 7,381,996 B2 * | 6/2008 | Hsin Chen | 257/100 |
| 2009/0224280 A1 | 9/2009 | Tsai et al. | |
| 2010/0213475 A1 | 8/2010 | Son | |

FOREIGN PATENT DOCUMENTS

| | | |
|---|---|---|
| JP | 2000-068532 | 3/2000 |
| KR | 10-2009-0030130 A | 3/2009 |
| KR | 10-2009-0047879 A | 5/2009 |
| KR | 10-2009-0047888 A | 5/2009 |
| KR | 10-2010-0003318 A | 1/2010 |

* cited by examiner

*Primary Examiner* — Elias M Ullah
(74) *Attorney, Agent, or Firm* — McDermott Will & Emery LLP

(57) ABSTRACT

Light-emitting device packages which may be manufactured using post-molding and with improved heat emission performance and optical quality, and methods of manufacturing the light-emitting device packages. The light-emitting device package includes: a heat dissipation pad; a light-emitting device formed on the heat dissipation pad; a pair of lead frames disposed to be spaced apart from each other at both sides of the light-emitting device and the heat dissipation pad; a molding member surrounding the side of the light-emitting device except for an emission surface of the light-emitting device; and bonding wires for electrically connecting the lead frames to the light-emitting device.

23 Claims, 15 Drawing Sheets

LIGHT-EMITTING DEVICE PACKAGE AND METHOD OF MANUFACTURING THE SAME

CROSS-REFERENCE TO RELATED APPLICATION

This application claims the benefit of Korean Patent Applications No. 10-2011-0004528, filed on Jan. 17, 2011 and No. 10-2011-0005984, filed on Jan. 20, 2011, in the Korean Intellectual Property Office, the disclosure of which is incorporated herein in its entirety by reference.

BACKGROUND

1. Field

The present disclosure relates to light-emitting device packages and methods of manufacturing the same, and more particularly, to light-emitting device packages which may be manufactured using post-molding and with improved heat emission performance and optical quality, and methods of manufacturing the light-emitting device packages.

2. Description of the Related Art

Light-emitting diodes (LEDs) are semiconductor light-emitting devices that change an electric signal into light by using characteristics of compound semiconductors. Semiconductor light-emitting devices such as LEDs have a longer lifetime than other general luminous bodies, are driven at a low voltage, and have low power consumption. Also, the semiconductor light-emitting devices such as LEDs have excellent response speeds and impact resistance and are small and light in weight. Such a semiconductor light-emitting device may emit lights having different wavelengths depending on the type and composition of a semiconductor used and if necessary, may form lights having other various wavelengths. Currently, lighting lamps using a white light-emitting device having high brightness have been replaced with general fluorescent lamps or incandescent lamps.

In order to provide lighting apparatuses using the semiconductor light-emitting devices, a packaging process, which connects a light-emitting device chip to a lead frame and sealed, is required. For example, in a general light-emitting device package, a lead frame, in which a cup-form molding member is pre-mold, is prepared, a light-emitting device chip is attached on the lead frame in the molding member so as to wire bond the light-emitting device chip and the lead frame, a phosphor is filled in the molding member so as to surround the light-emitting device chip, and finally, the molding member is sealed using a lens-form heat emission member.

However, in the light-emitting device package manufactured as above, the density of the phosphor is not uniform and thus optical quality deviation may be generated. Also, light emitted through the side of the light-emitting device chip may not be sufficiently used.

SUMMARY

Provided are light-emitting device packages having reduced optical quality deviation and improved optical efficiency and methods of manufacturing the same.

Provided are light-emitting device packages having simple manufacturing process and improved mechanical reliability and methods of manufacturing the same.

Additional aspects will be set forth in part in the description which follows and, in part, will be apparent from the description, or may be learned by practice of the presented embodiments.

According to an aspect of the present invention, a light-emitting device package includes: a heat dissipation pad; a pair of lead frames disposed to be spaced apart from each other at both sides of the heat dissipation pad; a light-emitting device formed on the heat dissipation pad; a molding member for surrounding and fixing the heat dissipation pad and the lead frames; and bonding wires for electrically connecting the lead frames to the light-emitting device, wherein the molding member is formed to surround the entire side of the light-emitting device formed on the heat dissipation pad, and the upper surface of the light-emitting device is exposed to the outside of the molding member at the upper surface of the molding member.

A bottom surface of the heat dissipation pad may be exposed to the outside of the molding member at a bottom surface of the molding member.

The lead frames may include wire bonding regions connected to the bonding wires and protruded toward the light-emitting device.

The wire bonding regions may be exposed to the outside of the molding member at the upper surface of the molding member, and the bottom surfaces of the lead frames may be partially exposed to the outside of the molding member at the bottom surface of the molding member.

A level of the upper surface of the molding member may be the same as a level of the upper surfaces of the wire bonding regions, and a level of the bottom surface of the molding member may be the same as a level of the bottom surface of the heat dissipation pad and a level of the bottom surfaces of the lead frames.

The lead frames may be bent so that the wire bonding regions adjacent to the light-emitting device are higher than the other portions of the lead frames.

Any one of the pair of lead frames disposed to be spaced apart from each other at both sides of the heat dissipation pad may be connected to the heat dissipation pad as a single body.

The heat dissipation pad may include a region, on which the light-emitting device is to be disposed, at the center thereof and a width of the heat dissipation pad other than the region, on which the light-emitting device is to be disposed, may be larger than a width of the center, on which the light-emitting device is to be disposed.

The light-emitting device package may further include a phosphor layer formed on the upper surface of the light-emitting device.

The molding member may be formed to surround the side of the phosphor layer.

The level of the upper surface of the molding member may be the same as the level of the upper surface of the light-emitting device, and the phosphor layer formed on the light-emitting device may be formed to be higher than the upper surface of the molding member.

The light-emitting device package may further include a lens-form transparent encapsulation member formed on the molding member and the light-emitting device.

The lead frames may not be bent and instead be flat, the upper surfaces of the lead frames may be filled in the molding member, and the bottom surfaces of the lead frames may be exposed to the outside of the molding member at the bottom surface of the molding member.

The molding member may include openings penetrating the molding member for partially exposing the lead frame to the outside and the bonding wires may be connected to the lead frames through the openings.

The molding member may include a white or colored molding material.

According to another aspect of the present invention, a method of manufacturing a light-emitting device package includes: disposing a pair of lead frames in parallel at both sides of a heat dissipation pad; disposing a light-emitting device on the heat dissipation pad; forming a molding member to surround the heat dissipation pad and the lead frames; and connecting bonding wires between the light-emitting device and the lead frames, wherein the molding member is formed to surround the entire side of the light-emitting device formed on the heat dissipation pad, and the upper surface of the light-emitting device is exposed to the outside of the molding member at the upper surface of the molding member.

The forming of the molding member may include disposing the heat dissipation pad, on which the light-emitting device is attached, and the lead frames in a metal molding member and then the molding member may be formed by transfer molding.

The method may further include forming a lens-form transparent encapsulation member on the molding member.

In the forming of the molding member, a bottom surface of the heat dissipation pad may be exposed to the outside of the molding member at the bottom surface of the molding member.

In the forming of the molding member, the wire bonding regions may be exposed to the outside of the molding member at the upper surface of the molding member, and the bottom surfaces of the lead frames may be partially exposed to the outside of the molding member at the bottom surface of the molding member.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
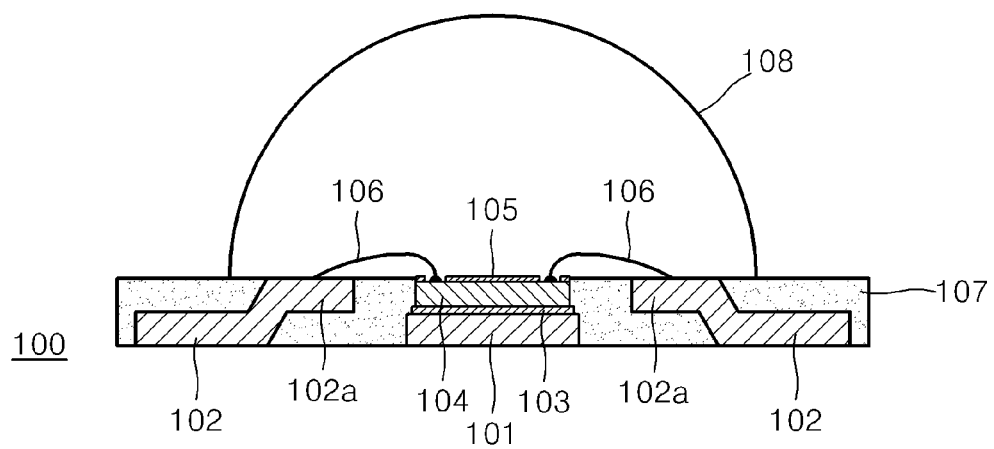
FIG. 1 is a cross-sectional view schematically illustrating a light-emitting device package according to an embodiment of the present invention.

Hereinafter, a method and apparatus for manufacturing a white light-emitting device according to one or more embodiment of the present invention will be described in detail with reference to the accompanying drawings. In the drawings, like reference numerals denote like elements and sizes of each element are exaggerated for clarity.

FIG. 1 is a cross-sectional view schematically illustrating a light-emitting device package 100 according to an embodiment of the present invention. Referring to FIG. 1, the light-emitting device package 100 may include a heat dissipation pad 101, a light-emitting device 104 disposed on the heat dissipation pad 101, a pair of lead frames 102 spaced apart from the heat dissipation pad 101 at both sides of the heat dissipation pad 101, a molding member 107 formed to surround the heat dissipation pad 101 and the lead frames 103, and a pair of bonding wires 106 electrically connecting the lead frames 102 and the light-emitting device 104. Also, the light-emitting device package 100 may further include a hemisphere lens-form transparent encapsulation member 108 disposed above the molding member 107 and the light-emitting device 104.

The light-emitting device 104 may be a semiconductor light-emitting device, for example, a light-emitting diode (LED). The light-emitting device 104 may be fixed on the heat dissipation pad 101 using, for example, an adhesive 103. Also, a phosphor layer 105 may be further coated on the light-emitting device 104. The phosphor layer 105 emits white light by being excited by light emitted from the light-emitting device 104. In this regard, the phosphor layer 105 may be formed by dispersing a type or types of phosphor in a resin according to a predetermined mixture ratio. The type of phosphor dispersed in the resin such as silicon resin or epoxy resin and mixture ratio of the phosphor may be selected according to an emission characteristic of the light-emitting device 104. The phosphor layer 105 is coated on the entire surface of the light-emitting device 104, except on electrode regions of the light-emitting device 104 for wire bonding.

The heat dissipation pad 101 and the lead frames 102 may be formed of a metal material, such as copper (Cu), having excellent heat conductivity and electric conductivity. As illustrated in FIG. 1, the heat dissipation pad 101 and the lead frames 102 are surrounded by the molding member 107. However, a bottom surface of the heat dissipation pad 101 may be exposed to the outside of the molding member 107 at a bottom surface of the molding member 107, in order to dissipate heat generated by the light-emitting device 104 to the outside. Also, the lead frames 102 include wire bonding regions 102a that are electrically connected to electrodes of the light-emitting device 104 through the bonding wires 106 formed of a material having high conductivity such as gold (Au). The wire bonding regions 102a may be exposed to the outside of the molding member 107 for wire bonding with the bonding wires 106. Accordingly, the bonding wires 106 may be connected to the wire bonding regions 102a of the lead frames 102 that are partially exposed at the upper surface of the molding member 107.

Also, the lead frames 102 are connected to an external power source (not shown) and provide a current to the light-emitting device 104. In order for the lead frames 102 to connect to the external power source, a part of the bottom surfaces of the lead frames 102 may be exposed to the outside of the molding member 107 at the bottom surface of the molding member 107, as illustrated in FIG. 1. For example, a level of the upper surface of the molding member 107 is the same as a level of the upper surfaces of the wire bonding regions 102a, and a level of the bottom surface of the molding member 107 is the same as a level of the bottom surface of the heat dissipation pad 101 and a level of the part of the bottom surfaces of the lead frames 102. In this regard, as illustrated in FIG. 1, the lead frames 102 may be bent so that the wire bonding regions 102a adjacent to the light-emitting device 104 are higher than the other parts of the lead frames 102. Both end side surfaces of the lead frame 102 may be surrounded by the molding member 107.

The molding member 107 may be formed to surround and fix the heat dissipation pad 101 and the lead frames 102. Also, the molding member 107 may be formed to surround the sides of the light-emitting device 104 except for the upper surface of the light-emitting device 104. That is, the upper surface of the light-emitting device 104 may be exposed to the outside of the molding member 107 at the upper side of the molding member 107. Accordingly, light emitted through the upper surface of the light-emitting device 104 may be guided to the outside of the light-emitting device package 100 through the lens-form transparent encapsulation member 108 without being obstructed by the molding member 107. The level of the upper surface of the molding member 107 may be higher than that of the upper surface of the light-emitting device 104 and may be the same as a level of the upper surface of the phosphor layer 105. Accordingly, the molding member 107 may surround the sides of the phosphor layer 105.

In the current embodiment of the present invention, the molding member 107 may be formed of a white color molding material having excellent light reflectivity. For example, the molding member 107 may be formed by mixing a material such as $TiO_2$ in a molding resin. Since the molding member 107 directly contacts the sides of the light-emitting device 104, when a molding material having excellent light reflectivity is used, light emitted from the sides of the light-emitting device 104 may be reflected and may be reused. Accordingly, light emission efficiency of the light-emitting device package 100 may be improved. Also, even though light is emitted to the side of the light-emitting device 104, the phosphor layer 105 may be coated only on the upper surface of the light-emitting device 104 and thus optical quality deviation of the light-emitting device package 100 may be reduced.

The encapsulation member 108 may include a transparent silicon resin and may have the form of a hemisphere lens. The encapsulation member 108 may be formed to completely cover the light-emitting device 104 exposed by the molding member 107 and parts of the lead frames 102. Here, the bonding wires 106 are completely in the encapsulation member 108 and fixed so that the bonding wires 106 may not be cut due to an external shock.

Figure 2:
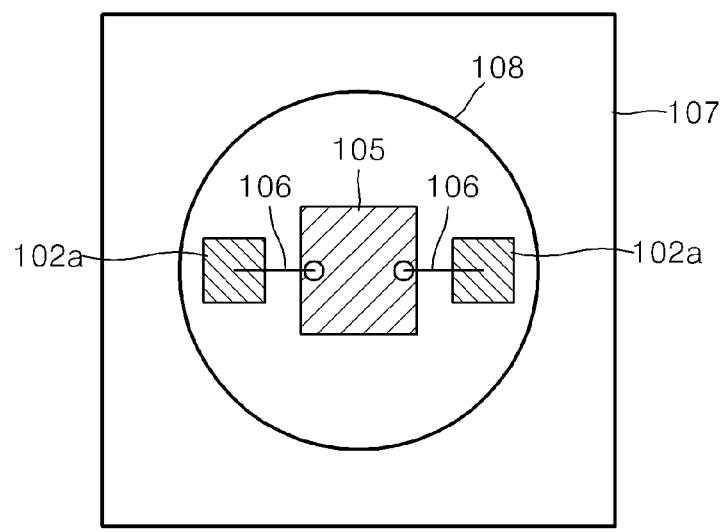
FIG. 2 is a plan view schematically illustrating the light-emitting device package of FIG. 1.

FIG. 2 is a plan view schematically illustrating the light-emitting device package 100. Referring to FIG. 2, the lens-form encapsulation member 108 is disposed on the molding member 107. In FIG. 2, the encapsulation member 108 is illustrated as a circular outline. In the encapsulation member 108 represented by the circular outline, the light-emitting device 104 under the phosphor layer 105 is disposed at the center thereof and the wire bonding regions 102a of the lead frames 102 are disposed at both sides of the light-emitting device 104. The bonding wires 106 are connected between the light-emitting device 104 and the wire bonding regions 102a of the lead frames 102.

Figure 3:
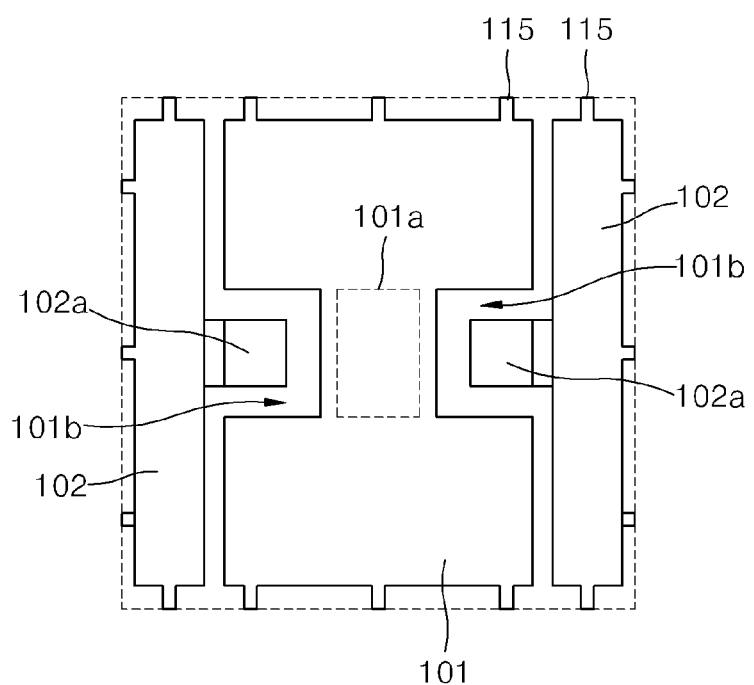
FIG. 3 schematically illustrates the form and arrangement of a heat dissipation pad and lead frames included in the light-emitting device package of FIG. 1.

FIG. 3 schematically illustrates the form and arrangement of the heat dissipation pad 101 and the lead frames 102 included in the light-emitting device package 100. Referring to FIG. 3, the heat dissipation pad 101 and the pair of the lead frames 102 disposed at both sides of the heat dissipation pad 101 are illustrated. A region 101a, on which the light-emitting device 104 is to be disposed, is illustrated at the center of the heat dissipation pad 101 using a dashed square. As illustrated in FIG. 3, a width of the heat dissipation pad 101 other than the region 101a, on which the light-emitting device 104 is to be disposed, is larger than a width of the region 101a, on which the light-emitting device 104 is to be disposed. Accordingly, the heat dissipation pad 101 has recesses 101b at both sides of the center of the heat dissipation pad 101. An area of the heat dissipation pad 101 may be maximized due to the form of the heat dissipation pad 101 and thus heat dissipation performance may be improved.

Also, the lead frames 102 disposed to be parallel at both sides of the heat dissipation pad 101 may include the wire bonding regions 102a protruded toward the region 101a, on which the light-emitting device 104 is to be disposed. The wire bonding regions 102a are each extended to the insides of the recesses 101b of the heat dissipation pad 101 from the sides of the lead frames 102 and thus face the region 101a, on which the light-emitting device 104 is to be disposed. As described above, since the lead frames 102 are bent, the wire bonding regions 102a may be formed to be higher than the other portions of the lead frames 102. In such a structure, the area of the lead frames 102 may be relatively reduced and the area of the heat dissipation pad 101 may be relatively increased so that heat dissipation performance of the heat dissipation pad 101 may be improved.

In FIG. 3, one heat dissipation pad 101 and the pair of lead frames 102 for manufacturing one light-emitting device package 100 are illustrated. However, actually, a plurality of the heat dissipation pads 101 and a plurality of the lead frames 102 may be connected to each other in the form of 2D matrix by a plurality of tie bars 115. Accordingly, in such a structure, the light-emitting device package 100 may be mass produced.

Figure 4:
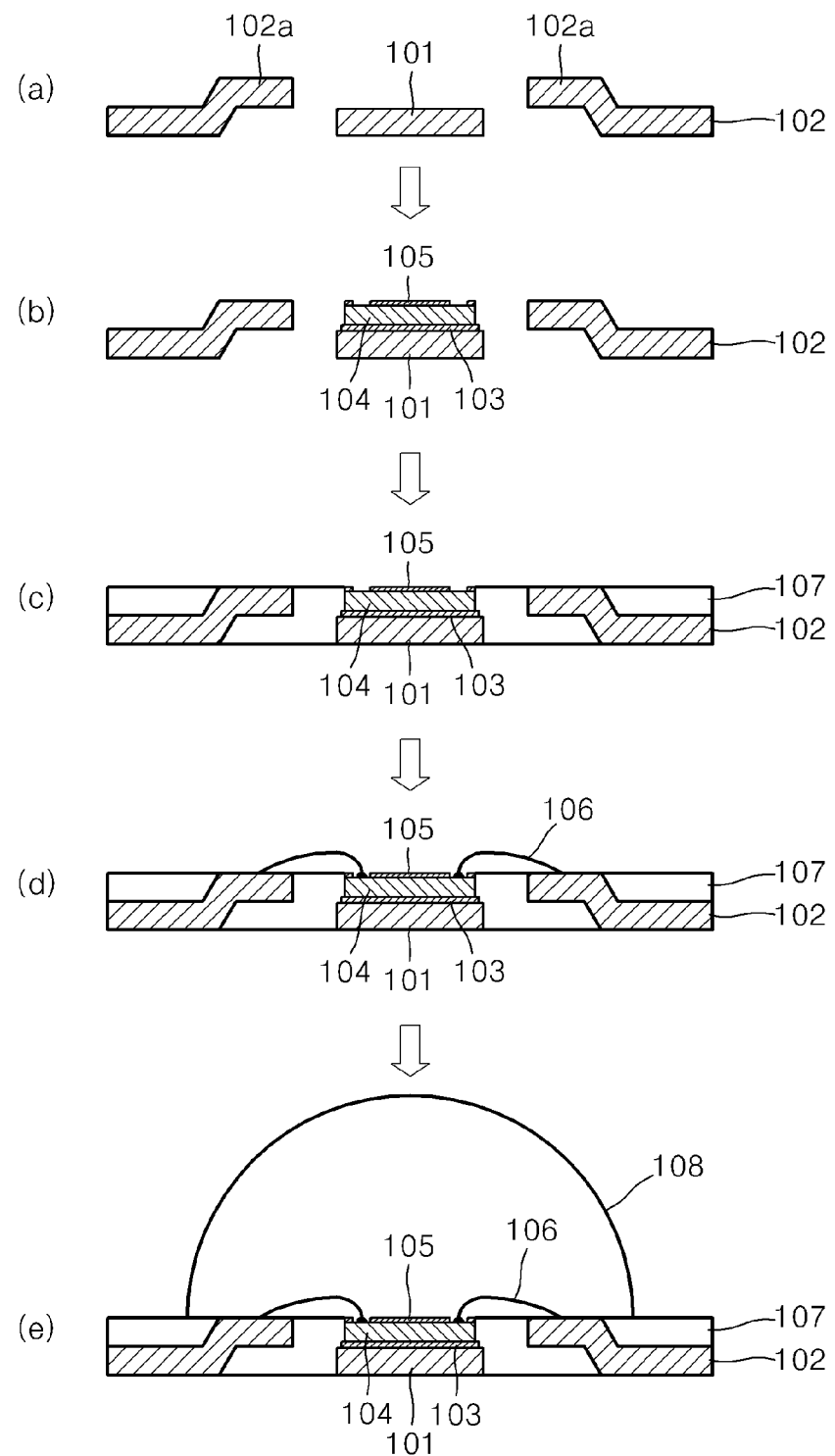
FIGS. 4A through 4E are cross-sectional views schematically illustrating a method of manufacturing the light-emitting device package of FIG. 1.

FIGS. 4A through 4E are cross-sectional views schematically illustrating a method of manufacturing the light-emitting device package 100. Referring to FIG. 4A, the pair of lead frames 102 are disposed at both sides of the heat dissipation pad 101, as illustrated in FIG. 3. Then, as illustrated in FIG. 4B, the light-emitting device 104 is attached on the heat dissipation pad 101 using the adhesive 103. Here, the phosphor layer 105 may be previously coated on the light-emitting device 104. However, the light-emitting device 104 may be attached on the heat dissipation pad 101 and then the phosphor layer 105 may be coated on the light-emitting device 104. If the light-emitting device 104 may emit white light, the phosphor layer 105 may be omitted. Also, when the light-emitting device package 100 emitting light of a specific color is manufactured, the phosphor layer 105 may not be coated on the light-emitting device 104.

Then, as illustrated in FIG. 4C, the molding member 107 is formed to surround the heat dissipation pad 101 and the lead frames 102. For example, the heat dissipation pad 101, on which the light-emitting device 104 is attached, and the lead frames 102 are disposed in a metal molding member and the molding member 107 may be formed by transferring molding. Here, the wire bonding regions 102a of the lead frames 102 and the upper surface of the light-emitting device 104 may be exposed at the upper surface of the molding member 107, and the bottom surfaces of the lead frames 102 and the heat dissipation pad 101 may be exposed at the bottom surface of the molding member 107. As described above, the molding member 107 may be formed of a white molding material having excellent light reflectivity. However, when light is not emitted from the side of the light-emitting device 104, the molding member 107 may be formed of, for example, a colored molding material such as black. Then, as illustrated in FIG. 4D, the bonding wires 106 are connected between the electrodes of the light-emitting device 104 and the wire bonding regions 102a. Then, as illustrated in FIG. 4E, the transparent encapsulation member 108 is formed on the molding member 107, thereby completing the manufacture of the light-emitting device package 100.

As described above, the light-emitting device package 100 according to the embodiment of the present invention may be manufactured by using post-molding in which the light-emitting device 104 is firstly disposed on the heat dissipation pad 101 and then the molding member 107 is formed on the heat dissipation pad 101 and the lead frames 102. Accordingly, in the post-molding, a space for positioning the light-emitting device 104 may be saved compared with pre-molding in which a molding member is firstly formed on lead frames or a heat dissipation pad. In this regard, a size of the light-emitting device package 100 may be reduced. When a light-emitting device package is manufactured by using pre-molding and a light-emitting device is disposed on a heat dissipation pad or lead frames later, a sufficient marginal space for disposing the light-emitting device in a molding member needs to be prepared. When the space having the same size as the light-emitting device is prepared, it may be hard to dispose the light-emitting device due to a process error. Accordingly, in pre-molding, waste of space may relatively increase.

Figure 5:
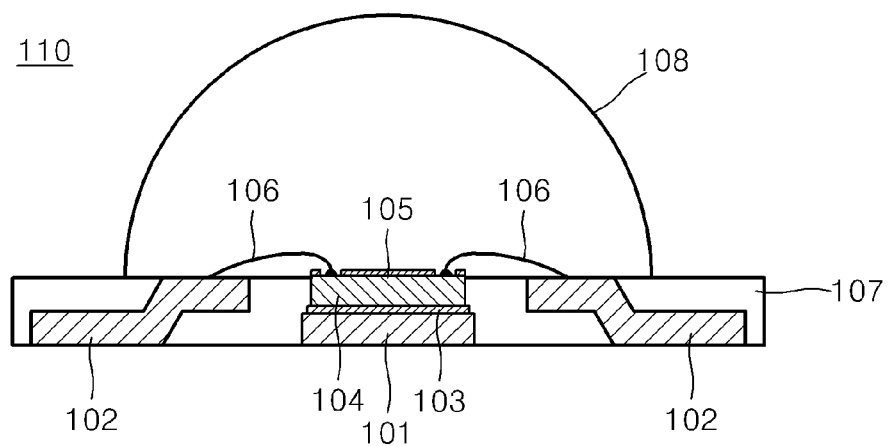
FIG. 5 is a cross-sectional view schematically illustrating a light-emitting device package according to another embodiment of the present invention.

FIG. 5 is a cross-sectional view schematically illustrating a light-emitting device package 110 according to another embodiment of the present invention. The light-emitting device package 110 of FIG. 5 is different from the light-emitting device package 100 of FIG. 1 in that a level of the upper surface of the molding member 107 is the same as a level of the upper surface of the light-emitting device 104 in the light-emitting device package 110. Accordingly, the phosphor layer 105 coated on the light-emitting device 104 is formed to be higher than the upper surface of the molding member 107. The other elements of the light-emitting device package 110 of FIG. 5 are the same as those of the light-emitting device package 100 of FIG. 1.

Figure 6:
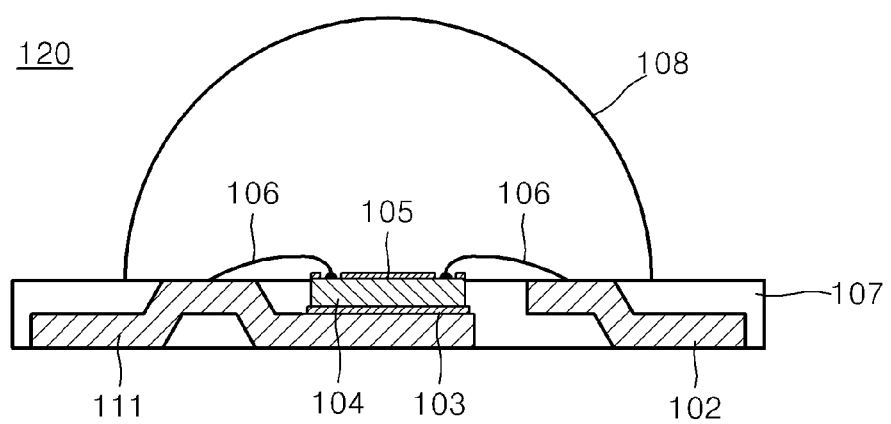
FIG. 6 is a cross-sectional view schematically illustrating a light-emitting device package according to another embodiment of the present invention.

FIG. 6 is a cross-sectional view schematically illustrating a light-emitting device package 120 according to another embodiment of the present invention. The light-emitting device package 120 of FIG. 6 is different from the light-emitting device package 110 of FIG. 5 in that any one of a pair of lead frames is connected to the heat dissipation pad as a single body in the light-emitting device package 120. That is, as illustrated in FIG. 6, the light-emitting device package 120 may include a first lead frame 111 connected to the heat dissipation pad to perform a heat dissipation function and a general second lead frame 102 that is not connected to the heat dissipation pad. The first lead frame 111 has a wide a heat dissipation area and thus a heat dissipation performance of the first lead frame 111 may be improved.

Figure 7:
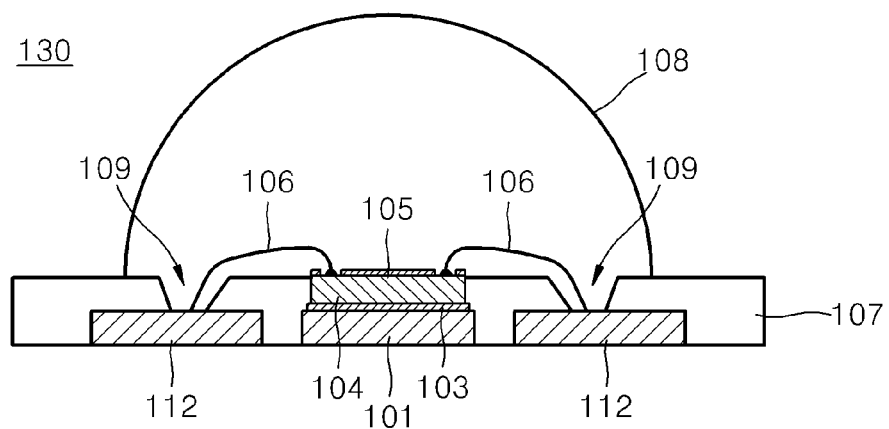
FIG. 7 is a cross-sectional view schematically illustrating a light-emitting device package according to another embodiment of the present invention.

FIG. 7 is a cross-sectional view schematically illustrating a light-emitting device package 130 according to another embodiment of the present invention. The light-emitting device package 130 of FIG. 7 is different from the light-emitting device package 110 of FIG. 5 in that flat lead frames 112 are included in the light-emitting device package 130 of FIG. 7, instead of the bent lead frames 102. Since the lead frames 112 are not bent and instead are flat, the upper surfaces of the lead frames 112 are covered by the molding member 107. Accordingly, for wire bonding, openings 109 penetrating the molding member 107 are formed in some parts of the molding member 107 on the lead frames 112. The lead frames 112 may be partially exposed to the outside through the openings 109. The bonding wires 106 may be connected to the lead frames 112 through the openings 109. In the current embodiment of the present invention, since the structure of the lead frames 112 is simple and thus a cost of manufacturing the lead frames 110 may be reduced.

Figure 8:
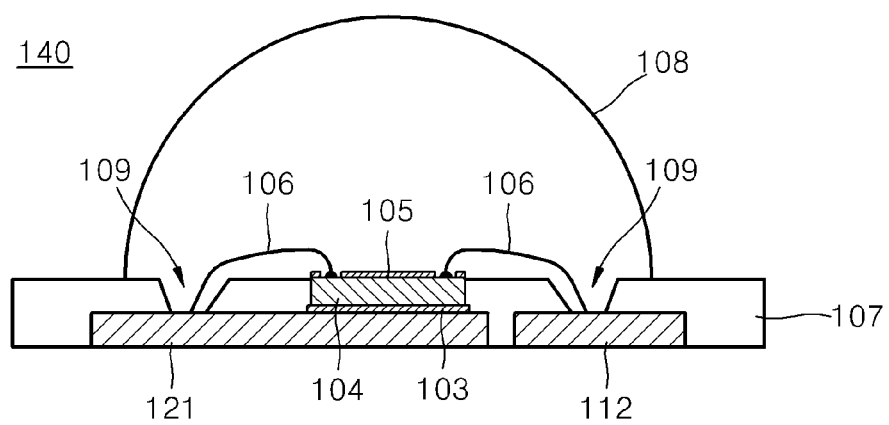
FIG. 8 is a cross-sectional view schematically illustrating a light-emitting device package according to another embodiment of the present invention.

FIG. 8 is a cross-sectional view schematically illustrating a light-emitting device package 140 according to another embodiment of the present invention. The light-emitting device package 140 of FIG. 8 is different from the light-emitting device package 130 of FIG. 7 in that any one of a pair of lead frames is connected to the heat dissipation pad in the light-emitting device package 140. That is, as illustrated in FIG. 8, the light-emitting device package 140 may include a first lead frame 121 connected to the heat dissipation pad to perform a heat dissipation function and a general second lead frame 112 that is not connected to the heat dissipation pad. The first lead frame 121 has a wide heat dissipation area and thus a heat dissipation performance of the first lead frame 121 may be improved.

In FIG. 8, the bonding wires 106 are connected to both the first lead frame 121 and the second lead frame 112. However, when a light-emitting device 104 having a vertical structure, in which one electrode is each formed on the upper surface and the bottom surface, is used, the bonding wire 106 may be connected only between the second lead frame 112 and the upper surface of the light-emitting device 104. The lower surface of the light-emitting device 104 may be electrically connected to the first lead frame 121 since the light-emitting device 104 is attached on the first lead frame 121 by using a conductive adhesive or by metal bonding. Then, the bonding wire 106 may not be separately connected to the first lead frame 121.

Figure 9:
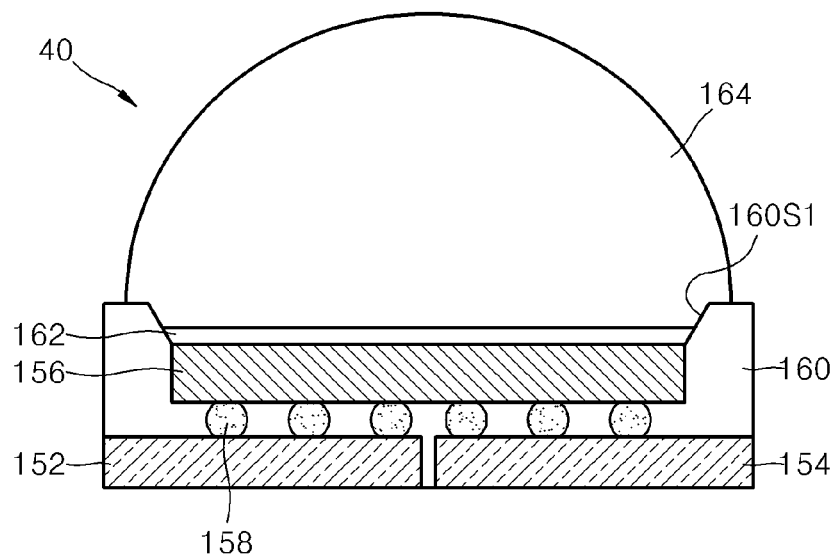
FIGS. 9 through 13 are cross-sectional views illustrating light-emitting device packages according to embodiments of the present invention and modified examples thereof.

In order to simplify the manufacturing process and improve the mechanical reliability of the light-emitting device package, it is possible to embody a light-emitting device package having no bonding wire. FIG. 9 is a cross-sectional view of a light-emitting device package 40 having no bonding wire according to an embodiment of the present invention.

Referring to FIG. 9, the light-emitting device package 40 includes first and second lead frames 152 and 154 that are spaced apart from each other, a light-emitting device 156, a fluorescent layer 162, a lens-form sealing member 164, a molding member 160, and flip-chip bonding solders 158. Any one of the first and second lead frames 152 and 154 may be a P-type electrode and other one may be an N-type electrode. The light-emitting device 156 may include, for example, a light emitting diode (LED) or a laser diode (LD). The light-emitting device 156 includes a P-type electrode and an N-type electrode. The P-type electrode of the light-emitting device 156 corresponds to the first or second lead frame 152 or 154 used as a P-type electrode. The N-type electrode of the light-emitting device 156 corresponds to the first or second lead frame 152 or 154 used as an N-type electrode. The first and second lead frames 152 and 154 and the light-emitting device 156 are flip-chip bonded to each other using the flip-chip bonding solders 158. The molding member 160 contacts sides of the light-emitting device 156. The molding member 160 covers the sides of the light-emitting device 156, fills a space between the light-emitting device 156 and the first and second lead frames 152 and 154, and fills a space between the first lead frame 152 and the second lead frame 154. The molding member 160 is a material having high light reflectivity and may be a white or colored molding material. When the molding member 160 is a white material, the molding member may be, for example, $TiO_2$. Also, the molding member 160 improves mechanical properties between the light-emitting device 156 and the first and second lead frames 152 and 154 and may be a material having high thermal conductivity. Since the sides of the light-emitting device 156 are covered by the molding member 160, light emitted from the sides of the light-emitting device 156 may be reflected to the upper part of the light-emitting device 156 and may be emitted in the same direction as a direction of light emitted from a light emission surface of an upper surface of the light-emitting device 156. Accordingly, since the amount of light emitted from the light-emitting device 156 may increase, brightness of the light-emitting device package 40 may increase. An upper surface of the molding member 160 is higher than the upper surface of the light-emitting device 156. The molding member 160 includes a downward inclination surface 160S1 from the inner edge of the molding member 160 to the edge of the upper surface of the light-emitting device 156. Since the upper surface of the molding member 160 is higher than the upper surface of the light-emitting device 156, the inside of the upper surface of the molding member 160 may be a concave region. The bottom of the concave region may be the upper surface of the light-emitting device 156. The upper surface of the light-emitting device 156 is covered by the fluorescent layer 162 having a uniform thickness. An upper surface of the fluorescent layer 162 is lower than the upper surface of the molding member 160. The fluorescent layer 162 may be a resin layer including a phosphor. The phosphor may be one type or plural types of phosphors. The resin layer may be, for example, a silicon layer. The convex lens-form transparent sealing member 164 covers the fluorescent layer 162 and the downward inclination surface 160S1 of the molding member 160 and partially covers the upper surface of the molding member 160. The sealing member 164 may include, for example, heat-resistant epoxy or silicon.

Figure 10:
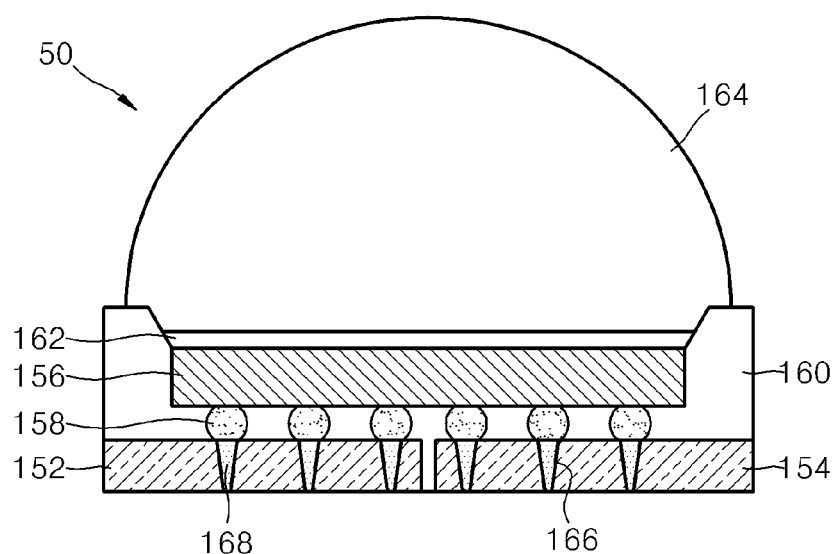

FIG. 10 is a cross-sectional view of a light-emitting device package 50 according to another embodiment of the present invention.

Figure 21:
FIG. 21 is a cross-sectional view trapezoid cross-sections of penetration holes formed in a light-emitting device chip installation area of a lead frame of light-emitting device packages according to embodiments of the present invention.
Figure 22:
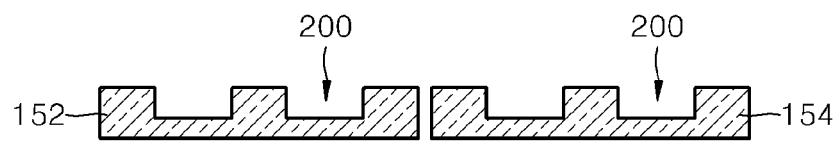
FIG. 22 illustrates grooves formed in a light-emitting device chip installation area of a lead frame of light-emitting device packages according to embodiments of the present invention.

Referring to FIG. 10, in the light-emitting device package 50, the first and second lead frames 152 and 154 each include a plurality of penetration holes 166 each filled with fillers 168. The plane form of the penetration holes 166 may be a circle, an oval, or a polygon, for example, a square. The cross-section of the penetration holes 166 may be a trapezoid or a square, as illustrated in FIG. 21. The inner surface of the penetration holes 166 may be a curved surface, instead of a plane. Also, instead of the penetration holes 166, grooves 200 may be formed in the first and second lead frames 152 and 154, as illustrated in FIG. 22. The flip-chip bonding solders 158 are between the light-emitting device 156 and the fillers 168 and contact both the light-emitting device 156 and the fillers 168. A filler 168 may be a material having conductivity and an adhesive property. The filler 168 may be, for example, solder paste and may be polymer including a nano-sized metal, for example, epoxy including silver (Ag). In the epoxy including silver (Ag), the amount of silver (Ag) may be greater than 0 and may be 90 wt % at maximum. The other elements of the light-emitting device package 50 may be the same as those of the light-emitting device package 40 and thus a description thereof is omitted. In the light-emitting device package 50, the first and second lead frames 152 and 154 and the flip-chip bonding solders 158 are not simply surface-contact as in the light-emitting device package 40 and instead the fillers 168 are inserted into the first and second lead frames 152 and 154. Accordingly, the adhesive strength between the first and second lead frames 152 and 154 and the light-emitting device 156 may increase.

Figure 11:
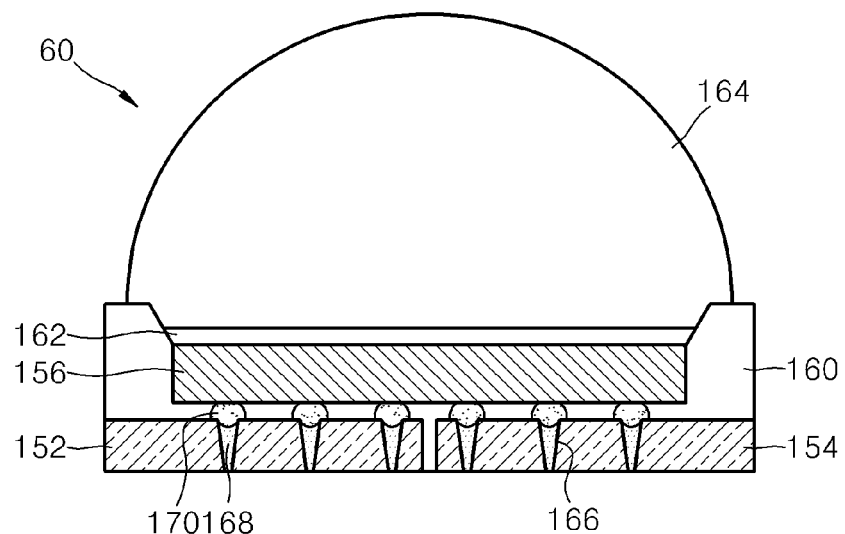

FIG. 11 is a cross-sectional view of a light-emitting device package 60 according to another embodiment of the present invention In the light-emitting device package 60, the flip-chip bonding solders 158 may be gold stud bumps 170, as illustrated in FIG. 11. When the flip-chip bonding solders 158 are the gold stud bumps 170, protrusion portions of the gold stud bumps 170 are stuck to the penetration holes 166 formed in the first and second lead frames 152 and 154. Accordingly, the adhesive strength between the light-emitting device 156 and the first and second lead frames 152 and 154 may increase.

Figure 12:
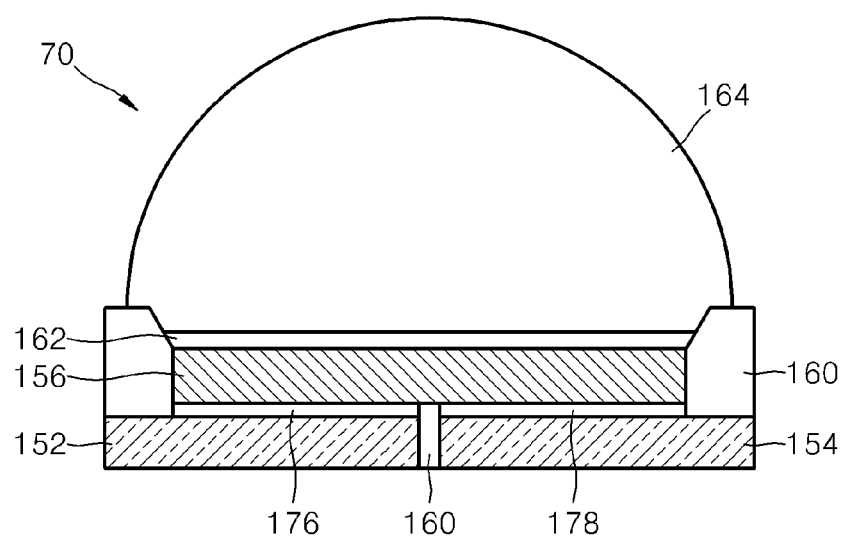

FIG. 12 is a cross-sectional view of a light-emitting device package 70 according to another embodiment of the present invention.

Referring to FIG. 12, instead of the flip-chip bonding solders 158, first and second metal bonding layers 176 and 178 are between the first and second lead frames 152 and 154 and the light-emitting device 156. The first and second metal bonding layers 176 and 178 may be adhesive layers having electric conductivity. The first and second lead frames 152 and 154 widely contact the light-emitting device 156 through the first and second metal bonding layers 176 and 178, respectively. The contact surface between the first and second lead frames 152 and 154 and the light-emitting device 156 may be larger than that of in the light-emitting device packages 50 and 60. In the light-emitting device package 70, since the bonding surface between the light-emitting device 156 and the first and second lead frames 152 and 154 is large, the adhesive strength therebetween may increase and heat emission may be efficient.

In the light-emitting device package 70 of FIG. 12, flip-chip bonding using solders, instead of the first and second metal bonding layers 176 and 178, may be performed.

Figure 13:
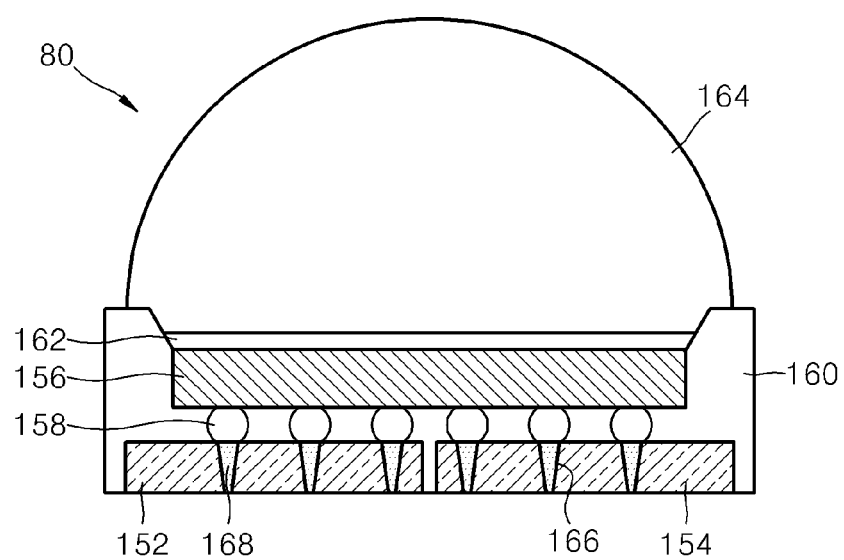

FIG. 13 is a cross-sectional view of a light-emitting device package 80 according to another embodiment of the present invention.

Referring to FIG. 13, the first and second lead frames 152 and 154 are in the molding member 160. That is, similar to the light-emitting device 156, the sides of the first and second lead frames 152 and 154 are covered by the molding member 160. Consequently, the first and second lead frames 152 and 154 are covered by the molding member 160 except for the bottom surfaces thereof. Accordingly, since the contact surface of the first and second lead frames 152 and 154 and the molding member 160 increases, mechanical bonding reliability between the first and second lead frames 152 and 154 and the molding member 160 may increase. In FIG. 13, the bottom surfaces of the first and second lead frames 152 and 154 are connected to a power source (not shown).

Figure 14:
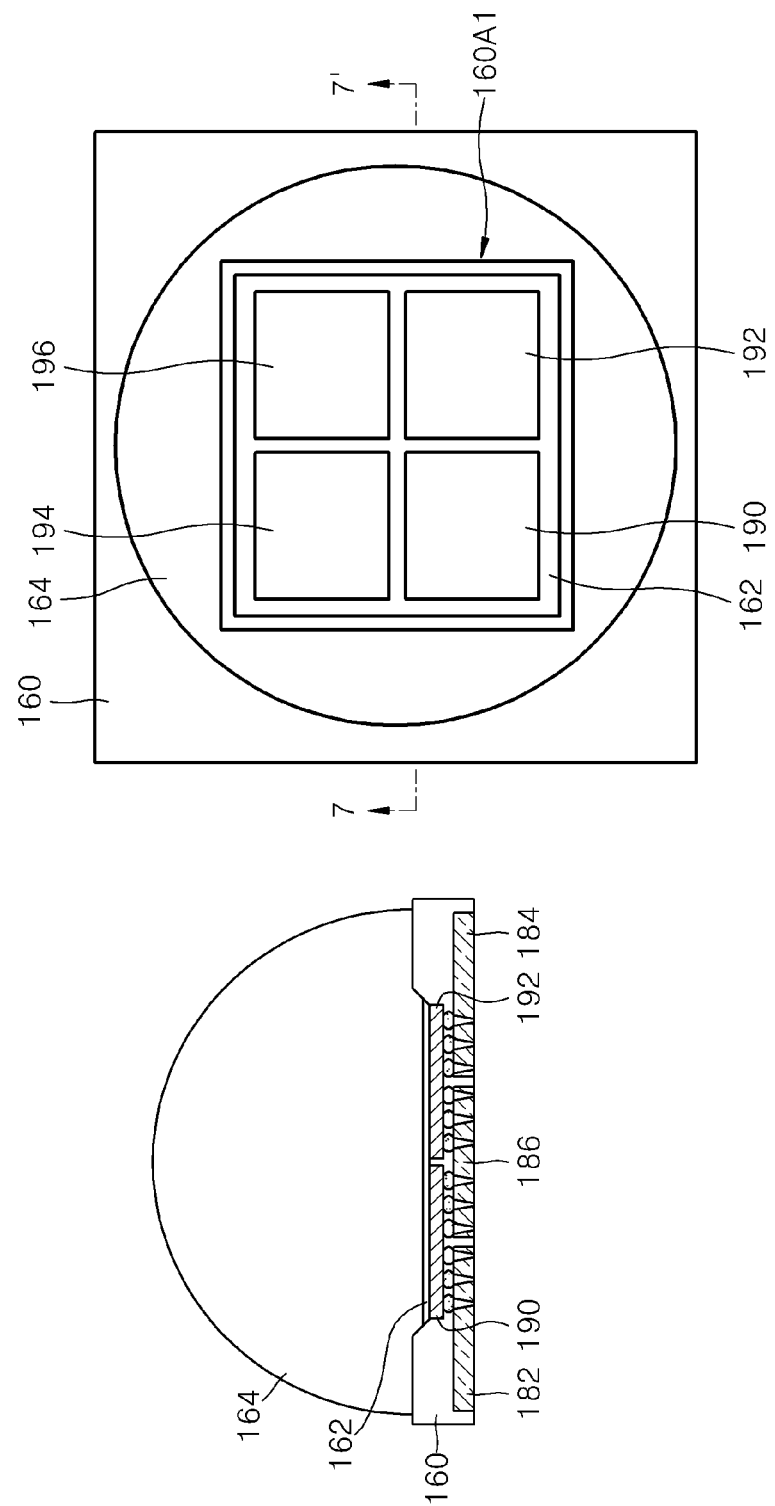
FIG. 14 is a cross-sectional view (left side) and a plan view (right side) illustrating that a multi-chip is installed in one light-emitting device package according to an embodiment of the present invention.

FIG. 14 is a cross-sectional view (left side) and a plan view (right side) illustrating that a plurality of light-emitting device, that is, a multi-chip, is installed in one light-emitting device package according to an embodiment of the present invention. In FIG. 14, the left side view is a cross-sectional view cut along a line 7-7' of the right side view.

Referring to FIG. 14, first through fourth light-emitting device 190, 192, 194, and 196 are installed on first through third lead frames 182, 184, and 186. The first through third lead frames 182, 184, and 186 and the first through fourth light-emitting device 190, 192, 194, and 196 may be bonded to each other in the same manner as described with respect to FIG. 10 or 11. Accordingly, the first through fourth light-emitting device 190, 192, 194, and 196 may be firmly installed on the first through third lead frames 182, 184, and 186. In FIG. 14, four light-emitting device, namely, the first through fourth light-emitting device 190, 192, 194, and 196, are installed in one package; however, the number of light-emitting device chips may be greater than or equal to 4 or less than or equal to 4. The first and second lead frames 182 and 184 may be the same electrodes, for example, p-type electrodes. The third lead frame 186 may be, for example, an N-type electrode. A concave area 160A1 of the molding member 160 is a square. The concave area 160A1 may be a circle circumscribed around the fluorescent layer 162 that covers the first through fourth light-emitting device 190, 192, 194, and 196 or may have other forms. The first through fourth light-emitting device 190, 192, 194, and 196 are installed in the concave area 160A1 of the molding member 160. The first through fourth light-emitting device 190, 192, 194, and 196 are installed in a lattice arrangement form. The relationship between the first through fourth light-emitting device 190, 192, 194, and 196 and the molding member 160 may be the same as described with reference to FIGS. 9 through 13. The first through fourth light-emitting device 190, 192, 194, and 196 and the first through third lead frames 182, 184, and 186 may be bonded to each other in the same manner as described with respect to FIG. 12. In FIG. 14, the first through third lead frames 182, 184, and 186 are covered by the molding member 160 except for the bottom surfaces thereof. However, the sides of the first and second lead frames 182 and 184 may be exposed outside of the molding member 160. It is not hard to form a light-emitting device package having various structures by combining the light-emitting device packages of FIGS. 9 through 14. Accordingly, examples of other light-emitting device packages except for the light-emitting device packages described above are omitted.

A method of manufacturing a light-emitting device package, according to an embodiment of the present invention, is described with reference to FIG. 15.

Figure 15:
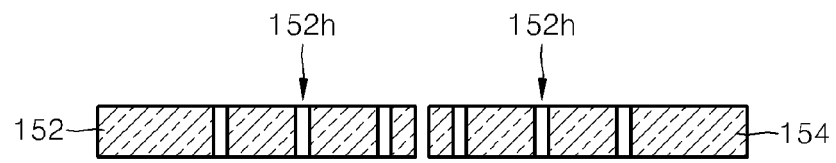
FIGS. 15 through 20 are cross-sectional views sequentially illustrating a method of manufacturing a light-emitting device package, according to an embodiment of the present invention.

Referring to FIG. 15, the first and second lead frames 152 and 154 are prepared. A plurality of holes 152h are formed in the first and second lead frames 152 and 154. The plane form of the holes 152h may be a circle, non-circle, or square. When the plane form of the holes 152h is a circle, a diameter of the hole 152h may be, for example, greater than 0 and less than or equal to 150 μm. When the plane form of the holes 152h is a quadrangle, the horizontal and vertical breadths of the hole 152h may be, for example, greater than 0 and less than or equal to 170 μm and greater than 0 and less than or equal to 100 μm, respectively. The cross-section of the holes 152h may be different from those illustrated in FIG. 15 and may be, for example, a trapezoid as illustrated in FIG. 21. Also, grooves 200 having predetermined depths may be instead formed at locations of the holes 152h of the first and second lead frames 152 and 154, as illustrated in FIG. 22.

Figure 16:
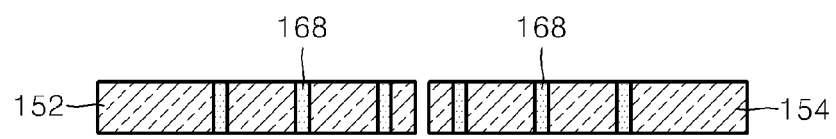

Then, as illustrated in FIG. 16, the holes 152h are filled with conductive materials 168, respectively. The conductive materials 168 may be solder paste or polymers including a nano-sized metal.

Figure 17:
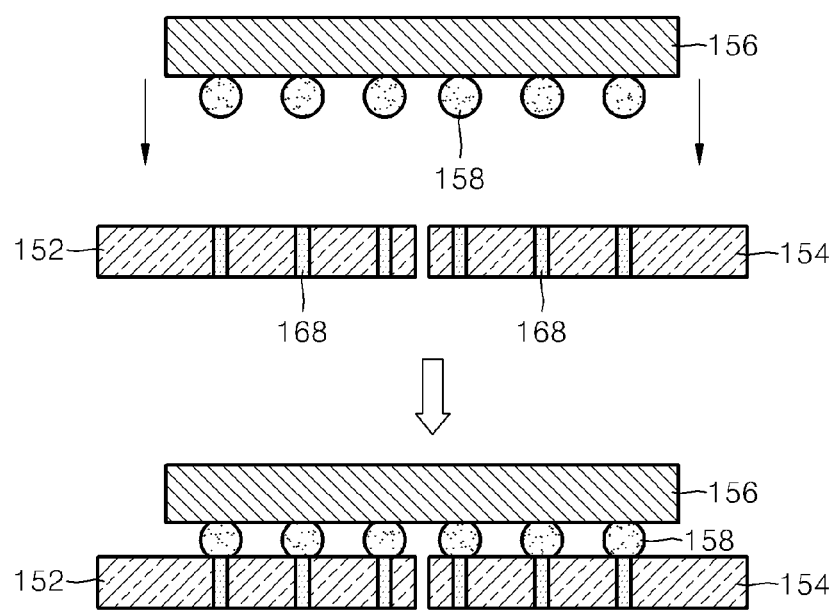

For flip-chip bonding, the light-emitting device 156, including the flip-chip bonding solders 158, are disposed on the first and second lead frames 152 and 154, as illustrated in FIG. 17. The flip-chip bonding solders 158 contact a P-type electrode and an N-type electrode (not illustrated) of the light-emitting device 156. The flip-chip bonding solders 158 of the light-emitting device 156 correspond to the holes 152h of the first and second lead frames 152 and 154 one-to-one. As such, when the light-emitting device 156 and the first and second lead frames 152 and 154 are disposed on each other, the light-emitting device 156 lowers so that the conductive materials 168 filled in the holes 168h of the first and second lead frames 152 and 154 are flip-chip bonded to the flip-chip bonding solders 158 of the light-emitting device 156, respectively.

Figure 18:
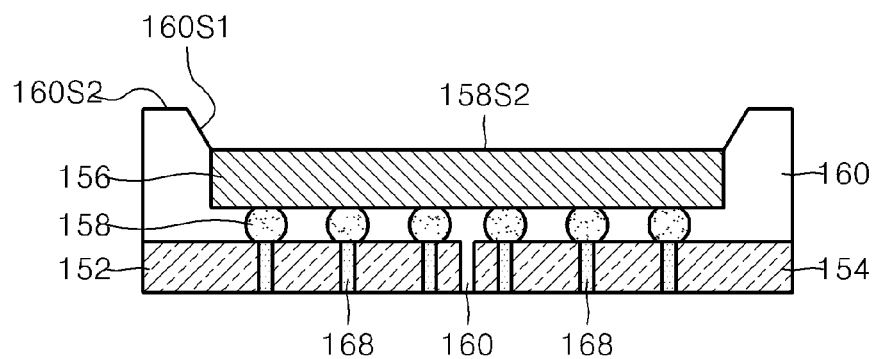

Then, as illustrated in FIG. 18, the molding member 160, covering the sides of the light-emitting device 156, is formed on the first and second lead frames 152 and 154. The molding member 160 is formed not only between the first lead frame 152 and the second lead frame 154 but also between the bottom surface of the light-emitting device 156 and upper surfaces of the first and second lead frames 152 and 154. Accordingly, a space between the flip-chip bonding solders 158 is filled with the molding member 160. When forming the molding member 160, an upper surface 160S2 of the molding member 160 is higher than an upper surface 158S2 of the light-emitting device 156. Accordingly, a part where the light-emitting device 156 is formed is a concave region of the molding member 160. Also, the molding member 160 is formed to have the downward inclination surface 160S1 between the upper surface 160S2 and the edge of the upper surface 158S2 of the light-emitting device 156. The downward inclination surface 160S1 may be a downward inclination surface from the inner edge of the upper surface 160S2 of the molding member 160 and to the edge of the upper surface of the light-emitting device 156. Since the downward inclination surface 160S1 is formed as part of the molding member 160, an emission angle of light emitted from the light-emitting device 156 may increase. That is, a viewing angle of the light-emitting device 156 may increase.

Figure 19:
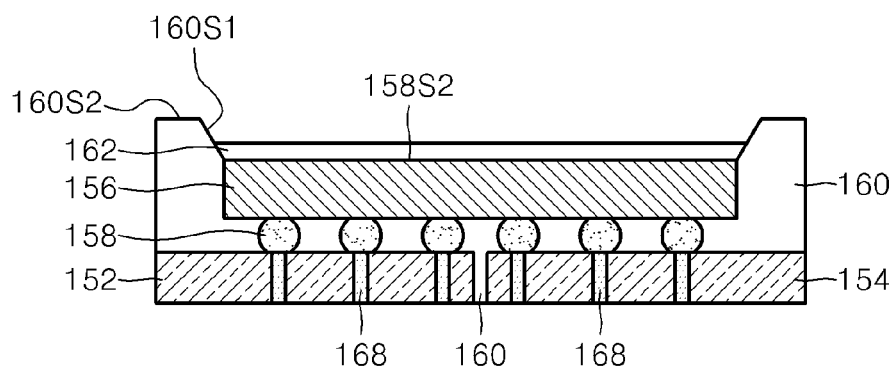

Then, as illustrated in FIG. 19, the fluorescent layer 162, covering the upper surface 158S2 of the light-emitting device 156, is formed on the concave portion of the molding member 160. The fluorescent layer 162 is formed only on the upper surface 158S2 of the light-emitting device 156, and the upper surface 158S2 of the light-emitting device 156 is flat so that the fluorescent layer 162 may have a uniform thickness. The fluorescent layer 162 may be a resin layer including one type or plural types of phosphors, and may be, for example, a silicon resin layer.

The fluorescent layer 162 may be formed prior to forming of the molding member 160. For example, the fluorescent layer 162 may be formed on the light-emitting device 156 prior to flip-chip bonding of the light-emitting device 156 and the first and second lead frames 152 and 154.

Figure 20:
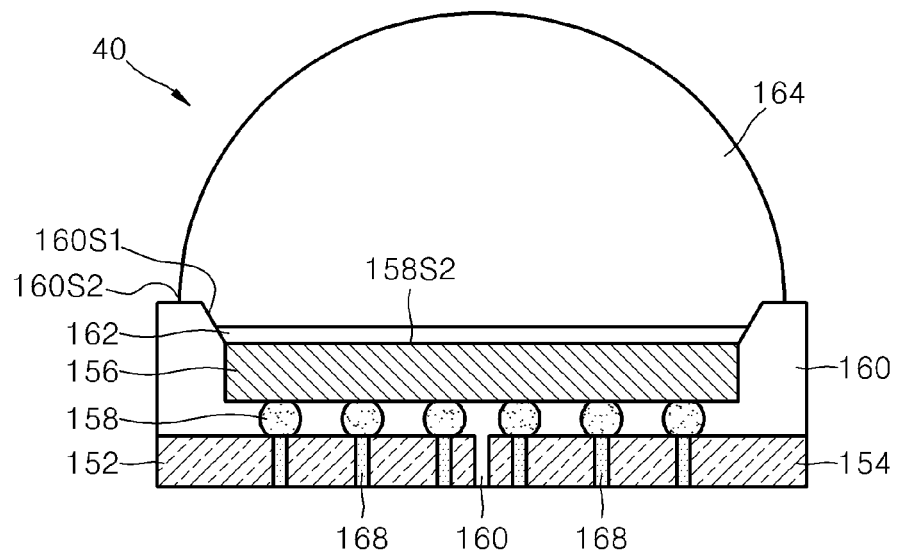

Then, as illustrated in FIG. 20, the lens-form sealing member 164 may be formed to cover the fluorescent layer 162. The sealing member 164 may be a flat board having a uniform thickness, instead of having a lens-form. The sealing member 164 may be formed to cover the downward inclination surface 160S1 of the molding member 160 and partially cover the upper surface 160S2 of the molding member 160. The sealing member 164 may include, for example, silicon or heat-resistant epoxy.

As illustrated in FIG. 14, when a plurality of light-emitting device chips, namely the first through fourth light-emitting device 190, 192, 194, and 196, are included in one package, the light-emitting device package may be manufactured as described with reference to FIGS. 15 through 20 except that three lead frames, namely, the first through third lead frames 182, 184, and 186 that are spaced apart from each other, are used.

Figure 23:
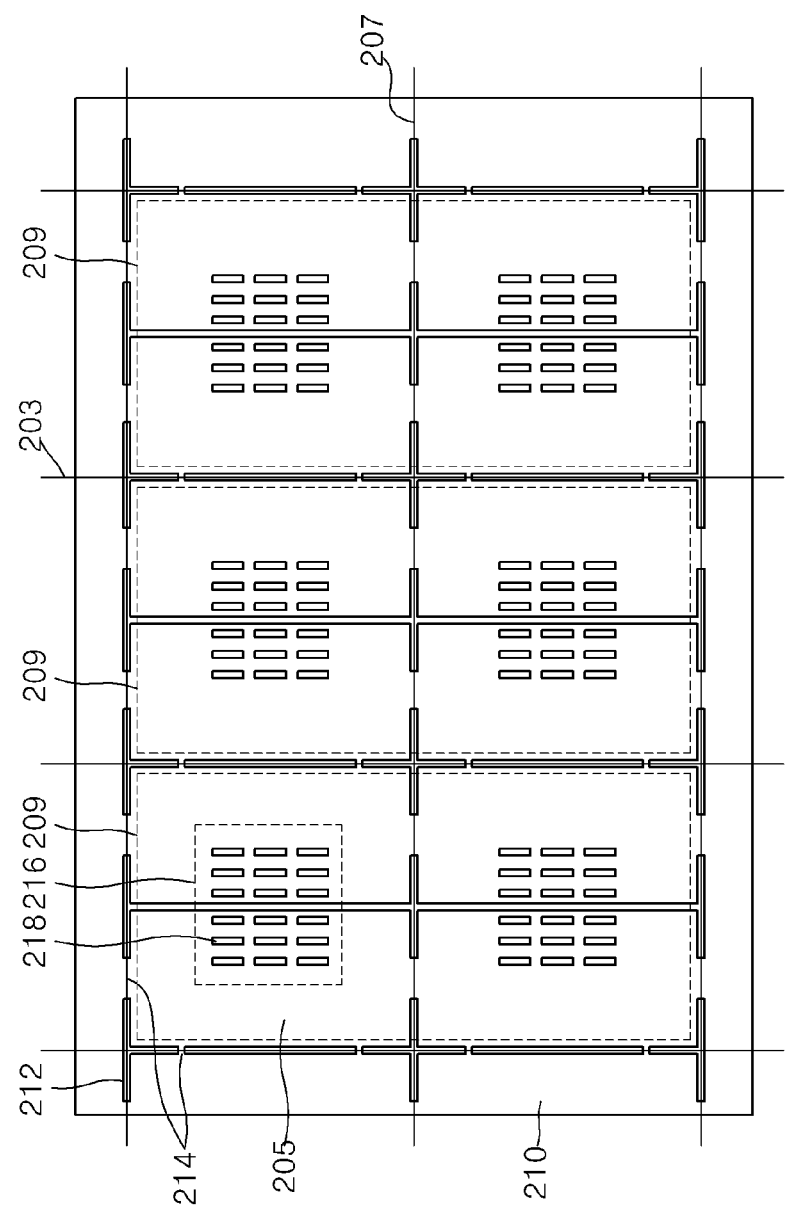
FIGS. 23 and 24 are plan views of lead frames used in light-emitting device packages according to embodiments of the present invention.
Figure 24:
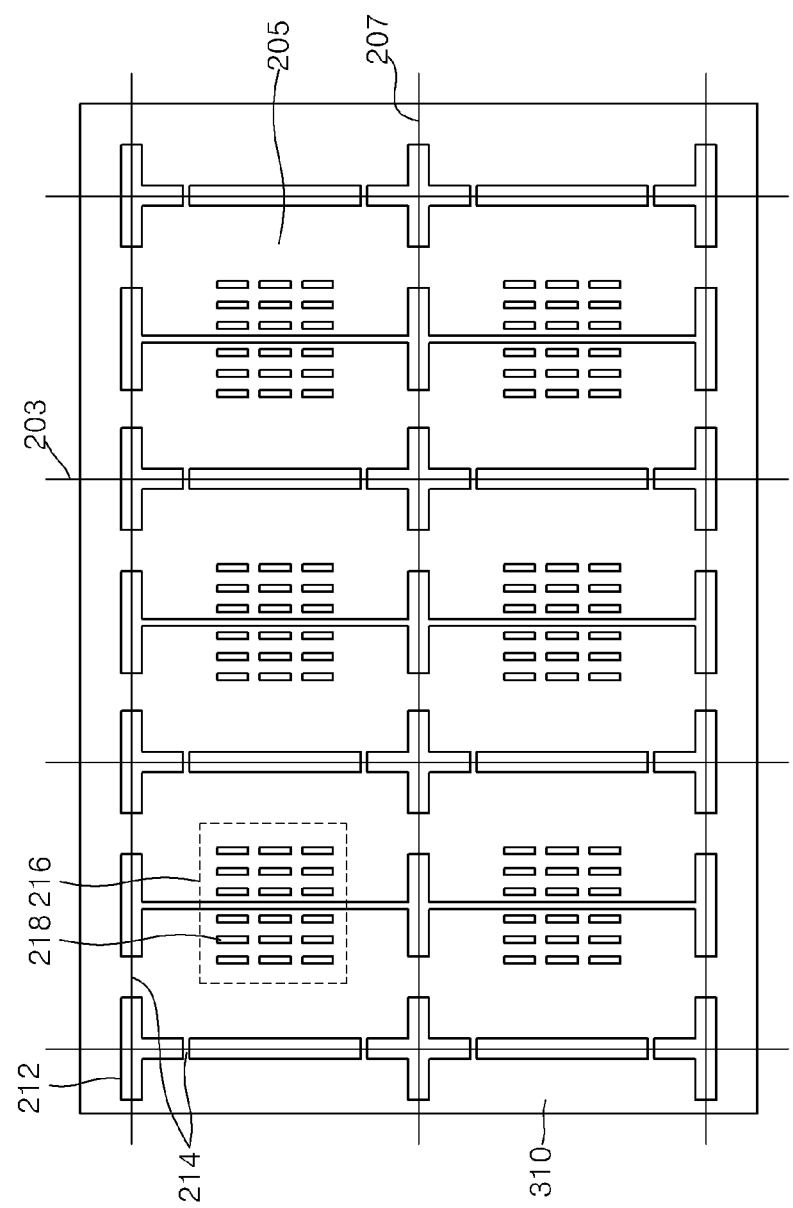

FIGS. 23 and 24 are plan views of lead frames 210 and 310 used in light-emitting device packages according to embodiments of the present invention.

For convenience of description, in FIGS. 23 and 24, only six unit lead frames 205 are included in the lead frames 210 and 310, respectively, in two rows and three columns; however, few tens or few hundreds of unit lead frames 205 may be included in the lead frames 210 and 310, respectively. A bump contact area 216 is at the center of each of the unit lead frame 205. The bump contact area 216 includes a plurality of holes 218. The plurality of holes 218 are filled with the conductive materials and correspond to solders of a light-emitting device chip, respectively.

In the lead frame 100 of FIG. 23, the unit lead frames 205 that are disposed vertically are simultaneously molded. That is, two unit lead frames 205 in a vertical direction are molded at once. In FIG. 23, horizontal and vertical lines 203 and 207 are cutting lines for separating the lead frame 210 into each unit lead frame 205. A dashed line 209 located inside the cutting lines 203 and 207 represents a molding area and a molding member is formed inside the dashed line 209. Accordingly, in FIG. 23, in each cut unit lead frame 205, edges thereof are partially exposed to the outside of the molding member 160 as in FIGS. 9, 10, and 11. In FIGS. 23 and 24, reference numeral 212 indicates slots formed at boundaries of each unit lead frame 205 and reference numeral 214 indicates a tie bar. The slots 212 may facilitate cutting. The tie bar 214 fixes each unit lead frame 205 to the lead frame 210 during molding.

In the lead frame 310 of FIG. 24, the edges of each unit lead frame 205 are located inside of the molding member 160, as illustrated in FIG. 13. In the lead frame 310 of FIG. 24, the entire lead frame 310, to which light-emitting device (not illustrated) is installed, is molded during a molding process, is cut along the cutting lines 203 and 207, and thereby separated into each unit lead frame 205. Accordingly, a unit light-emitting device package is formed.

As illustrated in FIG. 14, when a plurality of light-emitting devices are included in one package, the used lead frames may be the same as those of FIG. 23 or 24 except that each unit lead frame 205 of FIG. 23 or 24 constitute three lead frame parts. In FIG. 23 or 24, the unit lead frame 205 constitutes two lead frame parts.

Figure 25:
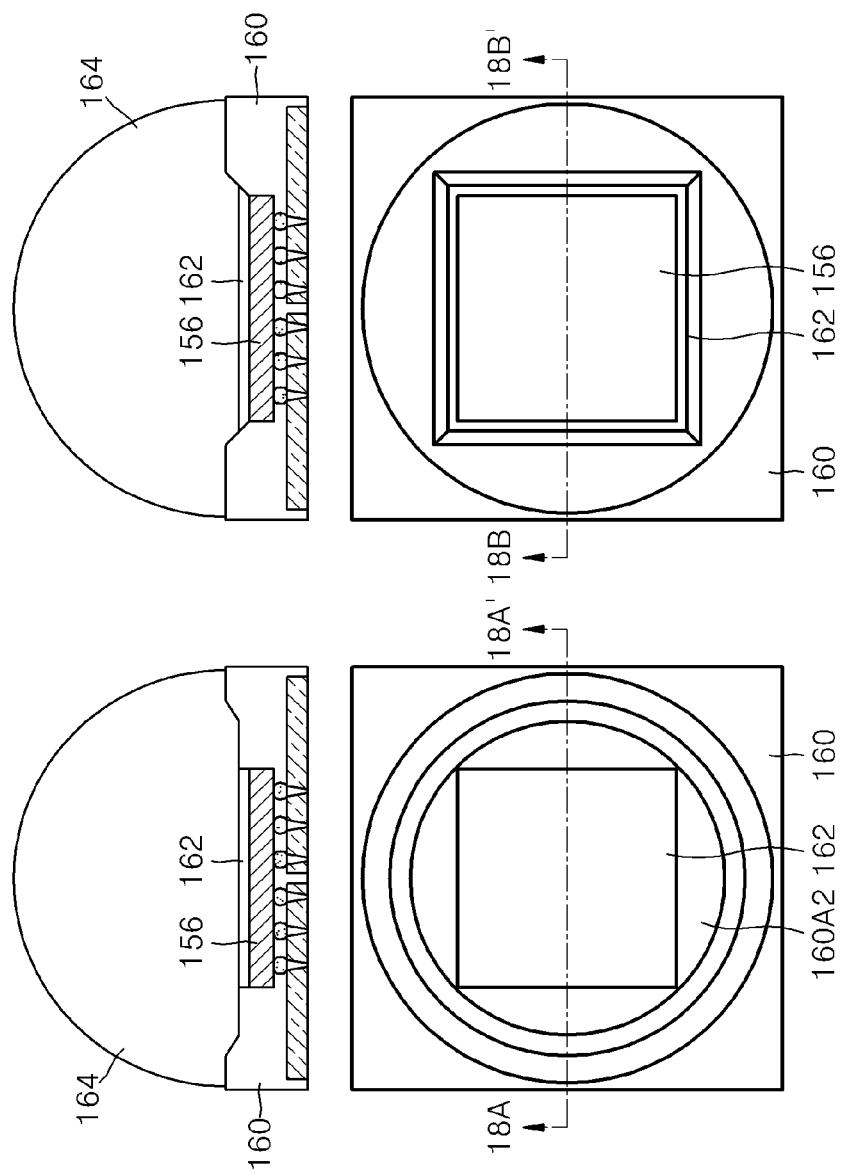
FIG. 25 is cross-sectional views (upper side) and plan views (lower side) illustrating upper side design of a mold in a light-emitting device package according to an embodiment of the present invention, wherein the upper left side of FIG. 25 is a cross-sectional view cut along a line 18A-18A' of a lower side thereof and the upper right side of FIG. 25 is a cross-sectional view cut along a line 18B-18B' of a lower side thereof.

FIG. 25 is cross-sectional views (upper side) and plan views (lower side) illustrating upper side design of the molding member 160 in a light-emitting device package according to an embodiment of the present invention, wherein the upper left side of FIG. 25 is a cross-sectional view cut along a line 18A-18A' of a lower side thereof and the upper right side of FIG. 25 is a cross-sectional view cut along a line 18B-18B' of a lower side thereof.

The left side of FIG. 25 illustrates that a plane form of a concave region 160A2 of the molding member 160 is a circle circumscribed the edge of the light-emitting device 156. Here, the surface of the concave region 160A2 of the molding member 160 has the same height as the surface of the fluorescent layer 162. The lower right side of FIG. 25 illustrates that a plane form of a concave region of the molding member 160 is a square as in the light-emitting device 156. Here, the area of the concave region of the molding member 160 may be the same as the light-emitting device 156.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing a light-emitting device package, the method comprising:
   disposing a pair of lead frames in parallel at both sides of a heat dissipation pad;
   disposing a light-emitting device on the heat dissipation pad;
   forming a molding member to surround the heat dissipation pad and the lead frames; and
   connecting bonding wires between the light-emitting device and the lead frames, wherein:
   the molding member is formed to surround the entire side of the light-emitting device formed on the heat dissipation pad, and the upper surface of the light-emitting device is exposed to the outside of the molding member at the upper surface of the molding member,
   the lead frames comprise wire bonding regions connected to the bonding wires, and
   in the forming of the molding member, the wire bonding regions are exposed to the outside of the molding member at the upper surface of the molding member, and the bottom surfaces of the lead frames are partially exposed to the outside of the molding member at the bottom surface of the molding member.

2. The method of claim 1, wherein the molding member comprises a white or colored molding material.

3. The method of claim 1, wherein the forming of the molding member comprises disposing the heat dissipation pad, on which the light-emitting device is attached, and the lead frames in a metal molding member and then the molding member is formed by transfer molding.

4. The method of claim 1, further comprising forming a lens-form transparent encapsulation member on the molding member.

5. The method of claim 1, wherein in the forming of the molding member, a bottom surface of the heat dissipation pad is exposed to the outside of the molding member at the bottom surface of the molding member.

6. A method of manufacturing a light-emitting device package, the method comprising:
   preparing lead frames, to which a light-emitting device is installed;
   installing the light-emitting device to the lead frames;
   forming a molding member that covers the side of the light-emitting device after installing of the light-emitting device;
   forming a fluorescent layer that covers a light emission surface of he light-emitting device; and
   forming a transparent sealing member that covers the fluorescent layer,
   wherein electrodes of the light-emitting device face the lead frames.

7. The method of claim 6, wherein the preparing of the lead frames further comprises:
   removing at least a part of the lead frames from various spots of the lead frames; and filling conductive materials to portions where the at least part of the lead frames is removed.

8. The method of claim 7, wherein the removing of the at least a part of the lead frames comprises forming a plurality of penetration holes in the lead frames.

9. The method of claim 7, wherein the removing of the at least a part of the lead frames comprises forming a plurality of grooves in the lead frames.

10. The method of claim 6, wherein in the installing of the light emitting device, the light emitting device and the lead frames are flip-chip bonded to each other.

11. The method of claim 10, wherein the light emitting device and the lead frames are flip-chip bonded to each other using gold stud bumps.

12. The method of claim 6, wherein the installing of the light emitting device comprises: forming an adhesive layer on area of the lead frames to which the light emitting device is to be installed; and installing the light emitting device on the adhesive layer.

13. The method of claim 6, wherein in the forming of the molding member, the molding member is formed between the light emitting device and the lead frames.

14. The method of claim 6, wherein in the forming of the molding member, the molding member is formed to cover the sides of the lead frames.

15. The method of claim 6, wherein a plurality of light emitting devices are installed on the lead frames and the lead frames comprise first through third lead frames to constitute a unit package.

16. The method of claim 6, wherein an upper surface of the molding member is formed to be higher than the fluorescent layer so as to form a concave region in the molding member.

17. The method of claim 6, wherein the concave region is a circle circumscribed around the light emitting device or is formed to be the same as the form of the light emitting device.

18. A method of manufacturing a light-emitting device package, the method comprising:

disposing a pair of lead frames in parallel at both sides of a heat dissipation pad;

disposing a light-emitting device on the heat dissipation pad;

forming a molding member to surround the heat dissipation pad and the lead frames;

connecting bonding wires between the light-emitting device and the lead frames; and forming a lens-form transparent encapsulation member on the molding member, wherein:

the molding member is formed to surround the entire side of the light-emitting device formed on the heat dissipation pad, and the upper surface of the light-emitting device is exposed to the outside of the molding member at the upper surface of the molding member, and the bonding wires are formed within the lens-form transparent encapsulation member.

19. The method of claim 18, wherein the molding member comprises a white or colored molding material.

20. The method of claim 18, wherein the forming of the molding member comprises disposing the heat dissipation pad, on which the light-emitting device is attached, and the lead frames in a metal molding member and then the molding member is formed by transfer molding.

21. The method of claim 18, wherein in the forming of the molding member, a bottom surface of the heat dissipation pad is exposed to the outside of the molding member at the bottom surface of the molding member.

22. The method of claim 18, wherein the lead frames comprise wire bonding regions protruding toward the light-emitting device and connected to the bonding wires.

23. The method of claim 22, wherein in the forming of the molding member, the wire bonding regions are exposed to the outside of the molding member at the upper surface of the molding member, and the bottom surfaces of the lead frames are partially exposed to the outside of the molding member at the bottom surface of the molding member.

* * * * *